United States Patent [19]
Tsoi et al.

[11] Patent Number: 4,580,155
[45] Date of Patent: Apr. 1, 1986

[54] DEEP DEPLETION CCD IMAGER

[75] Inventors: Hak-Yam Tsoi, Kanata; Joseph P. Ellul, Nepean, both of Canada

[73] Assignee: Northern Telecom Limited, Montreal, Canada

[21] Appl. No.: 452,011

[22] Filed: Dec. 21, 1982

[51] Int. Cl.$^4$ .............. H01L 29/78; H01L 27/14; H01L 31/00; G11C 19/28

[52] U.S. Cl. .................... 357/24; 357/23.12; 357/30; 377/60; 377/62

[58] Field of Search .............. 357/24, 30, 23.12; 377/57–63

[56] References Cited

FOREIGN PATENT DOCUMENTS 56-32764  4/1981  Japan .................. 354/24 M

OTHER PUBLICATIONS

Kosonocky et al., "Control of Blooming in Charge-Coupled Imagers", RCA Review, vol. 35, (3/74) pp. 2–24.

Dawson et al., "A CMOS/Buried-N-Channel CCD . . .", RCA Review, vol. 38, (9/77), pp. 406–435.

*Primary Examiner*—Gene M. Munson
*Attorney, Agent, or Firm*—Stuart L. Wilkinson

[57] ABSTRACT

An integrated circuit device has a high resistivity silicon substrate in which a low resistivity region exists. A charge coupled array is fabricated in the high resistivity region and an output circuit is fabricated in the low resistivity region. At the boundary between the high and low resistivity regions a floating diffusion provides charge coupling between the array and the circuit. The low resistivity region is prepared in a high resistivity substrate at a temperature in excess of 1000° C. to obtain a sufficiently deep low resistivity region but subsequent processing to produce the charge coupled array and the control circuit is performed at lower temperatures to minimize thermal degradation and contamination of the high resistivity region.

4 Claims, 12 Drawing Figures

DEEP DEPLETION CCD IMAGER

This invention relates to an integrated circuit having a high resistivity silicon substrate in which there exists a low resistivit region. The invention is particularly applicable to a charge coupled imager such as a selectable time delay and integration (TDI) imager which provides improved operational versatility by imaging in the visible, near-IR and soft X-ray regime without having resolution degradation in the near-IR and soft X-ray regions caused by carrier diffusion effects.

The functions of an imager are: (1) to detect energy radiating from an object; (2) to store a signal proportional to the incident radiation; and (3) to allow or provide for signal retrieval.

An imager consists of an array of sensors responsive to radiant energy incident on the array. For a typical application, such as document scanning, the image is focussed on the imager. Radiant energy from an elemental area of the object is incident on the sensor array for a predetermined integration time and converted to a proportional charge packet. Charge packets are periodically shifted in parallel to a shift register and then transversely shifted to an output structure for external sensing.

Some current imagers utilize charge coupled devices (CCDs). These devices which may be of the metal-oxide-silicon (MOS) type, store a charge in potential wells created either at the surface or in the semiconductor bulk and separated from each other by channel stops and/or suitably applied potentials in one direction and by suitably applied potentials in the other. The charge is transported along the surface or in the bulk by the application of bias potentials to alter the configuration of potential wells.

In a known imager, described in U.S. application Ser. No. 213,835 (Ibrahim et al), a two-dimensional charge coupled imaging device employing an 8-phase ripple clocking scheme is used to generate, store and clock packets of charge corresponding to sensed light. The accummulated charge is read into a linear 2-phase charge coupled serial shift register.

Radiant energy impinging on the silicon substrate is absorbed within this substrate and converted to charge. The position in the silicon where this energy-to-charge conversion occurs is dependent on the penetration depth of the energy in question. The amount of charge generated is proportional to the energy absorbed. Charge generated within a diffusion length from the surface is collected as discrete packets of charge in potential wells underneath sensing elements. When the penetration depth of the radiant energy is greater than the depletion layer width in the substrate, for a given applied potential, charges are generated in a neutral region of the substrate. These charges spread out due to diffusion effects before some reach the potential well underneath each sensing element. As a result charge mixing in adjacent sensing elements and smearing in the image results. This degrades the resolution of the image.

For most conventional charge coupled imagers, radiant energy penetration underneath the depletion layer occurs in the near IR and X-ray regions. Carrier diffusion effects thus impose a serious limit on the resolution of charge coupled imagers in these near IR and X-ray spectral regions. One approach to reduce the carrier diffusion effects on resolution degradation is to increase the depletion layer width in silicon for a suitable applied potential so that most of the radiant energy is absorbed within the depletion layer itself instead of underneath it. The electric field in the depletion layer sweeps the carriers towards the surface. This reduces the carrier transportation time and thus the amount of charge spreading due to diffusion effects. Since the depletion layer width in silicon increases with its resistivity, one way to improve the resolution is to make charge coupled imagers on high resistivity substrates.

For the near IR (wavelength from 0.8 to 1.0 microns) and soft X-ray (1 to 10 KeV) regions, substrate resistivities as high as 5 K$\Omega$-cm are required to produce the required depletion layer width. There are a number of reported problems in fabricating charge-coupled imagers on such a high resistivity substrate. First a resistivity drop has been reported due both to thermal degradation for processing temperatures greater than 950° C. and to impurity contamination. Secondly, even if resistivity were preserved, transistors fabricated on such high resistivities cannot function due to the extremely low punch-through voltage between source and drain. However, due to performance requirements, charge detection is only practical with on-chip transistor circuitry.

To make a charge-coupled imager and its associated on-chip transistor output circuitry on the same chip, a device is proposed according to the present invention having adjacent regions of high resistivity and low resistivity on the same chip.

One aspect of the invention is to provide high and low resistivity regions on the same chip built on a high resistivity substrate for the charge coupled device and the on-chip transistor preamplifier, respectively, by using a selective doping step. This is done by defining, at the design stage, a first region on the chip for the charge-coupled imager and a second region on the chip for on-chip transistor output circuitry. Then during a substrate preparation process, an additional masked ion implantation step is used to raise the substrate doping only in the second region to a predetermined doping level. The location of the boundary of the two regions is selected such that neither the function of the charge-coupled imager nor the function of the on-chip transistor preamplifier circuitry is jeopardized.

In most practical CCD imager circuit designs, signal charge is coupled between the charge-coupled imager and the output transistor circuitry by means of a floating diffusion. The output signal level is inversely proportional to the capacitance of the floating diffusion node. For high gain charge detection circuitry, it is important to keep the total sum of stray capacitance, floating diffusion capacitance, and output preamplifier transistor gate capacitance at the floating diffusion node to a minimum. In fact, in most practical designs, the output transistor circuitry and the charge coupled device are often in one continuous device well to minimize stray capacitance. The output circuitry and the charge coupled device are physically intact and not separable. There exists a prime location for the boundary of the high resistivity region and the low resistivity region which will not affect the continuity of the CCD to the output transistor preamplifier circuitry and will not degrade the performance of the circuitry nor increase the floating diffusion node capacitance. This location is at the floating diffusion.

According to another aspect of the invention there is provided a processing technique for fabricating regions of high resistivity and regions of low resistivity on the same chip simultaneously. The resistivity of the high resitivity region is preserved during the fabrication process by minimizing the possibility of contamination of the high resistivity region.

To form the low resistivity region, the method used comprises:

(i) taking a high resistivity silicon wafer;
(ii) positioning two capping layers over a first surface region;
(iii) implanting ions into a site of the wafer where the top capping layer has been selectively removed and into a section of the wafer which is designated as low resistivity;
(iv) heating the wafer 1050° C. for more than 40 hours to cause the implanted ions to diffuse into the wafer to form a low resistivity region greater than 5 microns deep;
(v) removing damage due to ion implantation by oxidation of the damaged silicon region; and
(vi) removing all of the capping layers at low temperature.

An embodiment of the invention will now be described by way of example with reference to the accompanying drawings in which.

Figure 1:
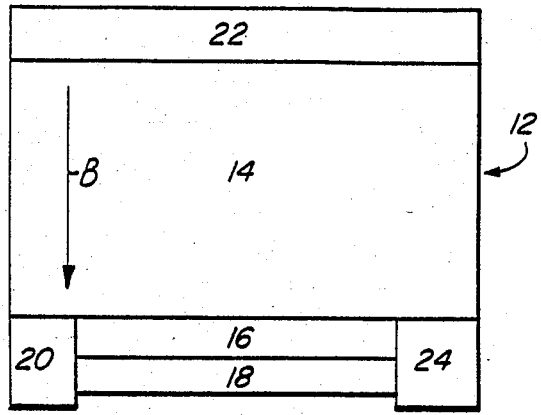
FIG. 1 is a schematic representation of the elements of an imager embodying the invention.

Referring particularly to FIG. 1, there are shown schematically the primary components of TDI imager 12.

The imager has a charge coupled image sensing region 14 over which discrete charge packets are integrated in response to incident radiant energy, the charge packets being periodically clocked in the direction of arrow B in a known manner to the output circuitry.

Parallel-to-serial interface circuitry 16 operates to transfer charge packets at the output end of the region 14 to a serial, charge coupled shift register 18. Electrical inputs 20 and 22 supply charge carriers to charge coupled components 14 and 18. An analogue signal corresponding to the received image is taken from the shift register output 24.

This image sensing part of the imager chip is fabricated in a high resistivity part of the substrate. Other parts of the imager including a guard band and output circuitry are fabricated in a low resistivity part of the substrate.

Figure 2:
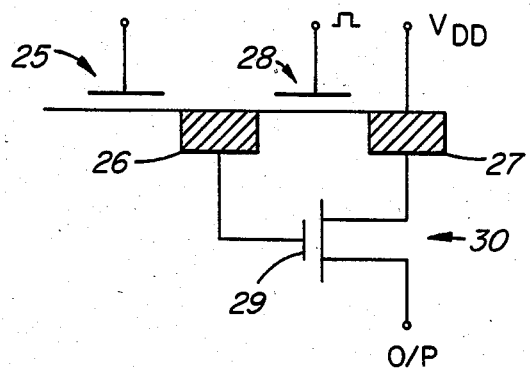
FIG. 2 is a schematic view of an imager output transistor preamplifier circuitry using a floating diffusion.

Referring to FIG. 2, an output transistor preamplifier circuit consists of a floating diffusion 26, a reset transistor 28 and a source follower 30. The floating diffusion 26 is reset periodically and charge is integrated by the floating diffusion 26 and read-out by the source follower 30.

Figure 3:
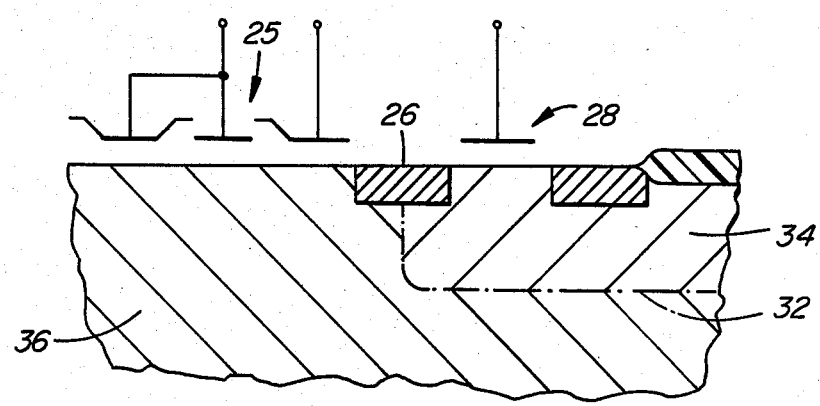
FIG. 3 is a cross-sectional view of a boundary between a high resistivity region and a low resistivity region of an imager.

Referring to FIG. 3, a boundary 32 between the low 34 and the high 36 resistivity regions is made at the floating diffusion 26. The floating diffusion width of approximately 10 microns is large enough for the implant boundary considering the necessary clearance required for mask registration. The low resistivity region 34 is formed by masked ion implantation. The fabrication method of the present invention to be described presently results in a CCD in high resistivity substrate and transistors in low resistivity substrate without affecting the function of each.

Figure 4:
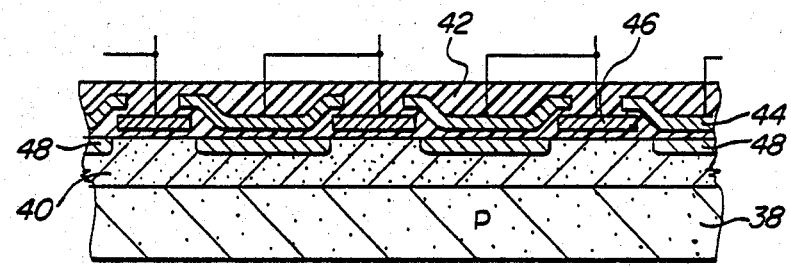
FIG. 4 is a part-sectional view of part of a charge coupled imager element according to the invention.

Referring to FIG. 4 the charge coupled imaging element comprises a p-type silicon substrate 38, an n-type layer 40 and a silicon dioxide insulating layer 42.

A row of polysilicon conductive field plates 44 and 46 within the insulating layer function as storage and transfer electrodes in a known manner, packets of charge being transferred under the control of clock pulses applied to the field plates. An n-type (arsenic) implant 40 under all electrodes and a p-type (boron) compensated implant 48 under the transfer electrodes only, control directionality of minority carrier charge transpot.

Figure 5:
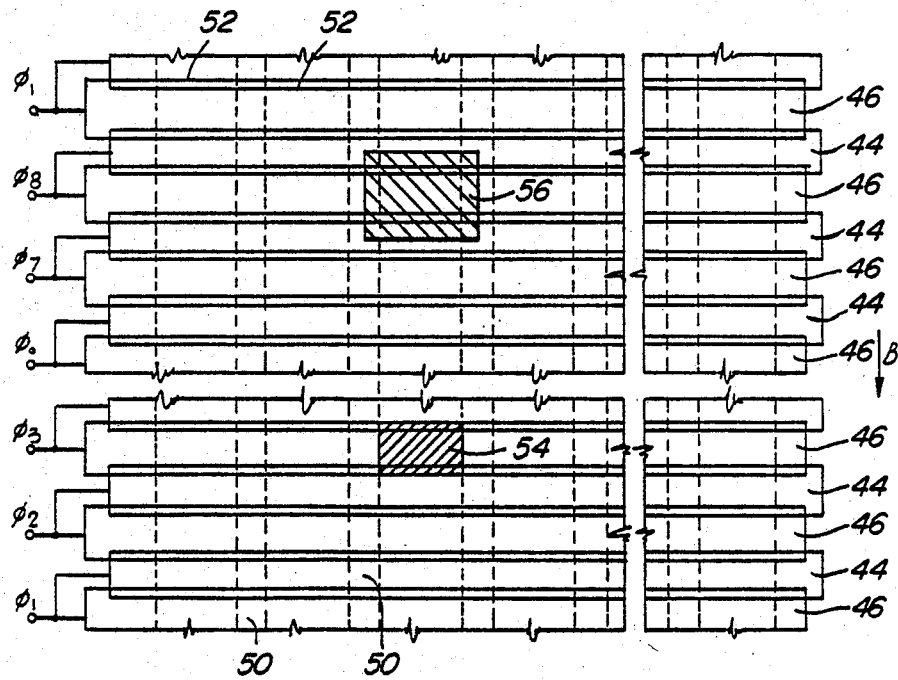
FIG. 5 is a schematic plan view of part of a charge coupled imager element.

As shown in FIG. 5 strips 50 of insulating silicon dioxide which are parallel to the clocking direction B and have a thickness of approximately 1 micron on the silicon substrate, define a number of parallel channels 52 within which minority carrier charge is confined.

In operation, electron-hole pairs are generated in the silicon on absorption of incident light energy. Electrons are stored under the potential minima, the number of electrons being proportional to the incident light level. The potential existing at the p-compensated implants normally presents a potential barrier to prevent generated charge from escaping from potential wells 54 underlying the storage electrodes 46. The potential wells are thus defined essentially by the sites between the thick oxide strips 50 and the transfer electrodes 44. Since charge is generated over the total area of the sensing region 14, the charge stored at a potential well 54 derives from a corresponding charge collection or pixel 56 area bounded by the centre-to-centre spacing of the transfer electrodes 44 and the insulating strips or guard bands 50.

Using known MOS fabrication techniques a storage area of 8 microns×9 microns and a pixel area of 13 microns×12 microns have been achieved.

Figure 6:
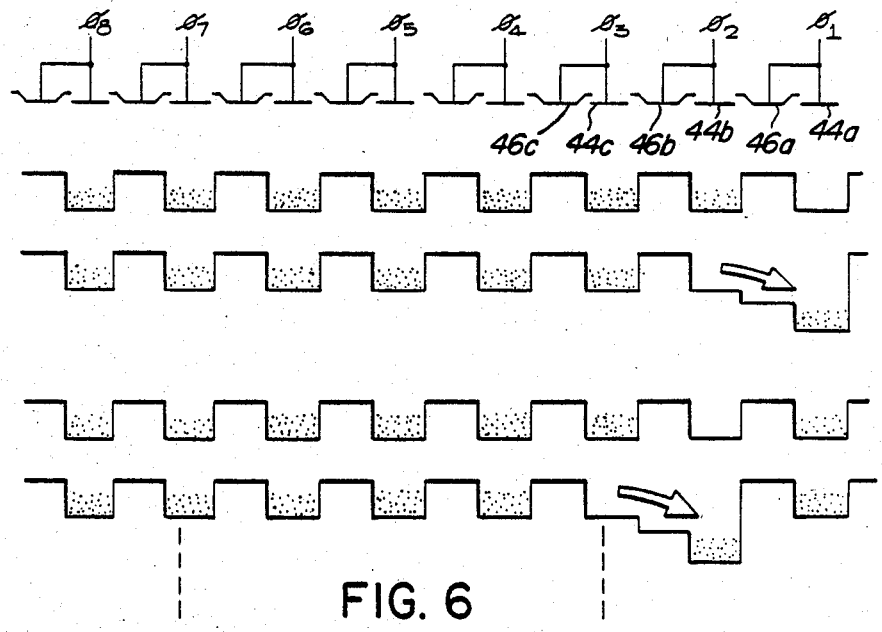
FIG. 6 shows an example of variations with time, in potential level existing along a channel of the FIG. 5 element.

Operation of the charge coupled imaging element 14 is now explained with reference to FIG. 6 which shows, schematically, the potential variation existing along an 8-stage section of a 96-stage channel, each stage corresponding to a pairing of one storage electrode and an adjacent transfer electrode. Charge transfer between stages is achieved by application of 8-phase ripple clocking potentials to successive leads of the sets of leads $\emptyset_1$ to $\emptyset_8$ each of which leads are electrically connected to respective electrode pairs. During a period $\Delta t$ application of a clocking pulse to lead $\phi_1$ deepens the potential well under storage electrode 44a and removes the potential barrier under transfer electrode 46a. Charge stored under storage electrode 44b then then gravitates into the potential well under storage electrode 44a. Subsequently the potential on $\phi_1$ is removed to restore the original potential distribution with the potential well under storage electrode 44b now being devoid of charge.

Figure 7:
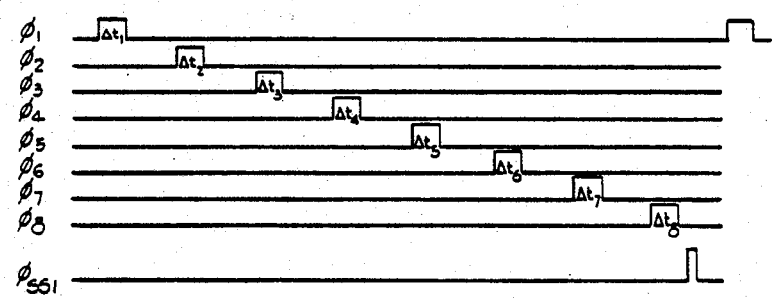
FIG. 7 is a timing diagram showing application of 8-phase ripple clocking to the FIG. 5 element.

By applying ripple clocking to leads $\phi_2$ through $\phi_8$, as shown in the timing diagram of FIG. 7, the potential well under storage electrode 44c is emptied into the empty well under storage electrode 44b during interval $\Delta t_2$; the potential well under storage electrode 44d is then emptied into the empty well under storage electrode 44c, during interval $\Delta t_3$ etc.

In fact the potential wells are only momentarily free of charge since charges are produced continuously through photon absorption. As long as the number of phases in the ripple clock is high, the consequent charge sharing has a negligible effect on the image produced.

On completion of each ripple clocking cycle, charge packets under $\phi_1$ of the last set of leads $\phi_1$ to $\phi_8$ are transferred from the region 14 into a 2-phase, charge coupled serial shift register via the parallel-to-serial interface circuitry 16. The structure and operation of the shift register will be well understood in the art.

Figure 8:
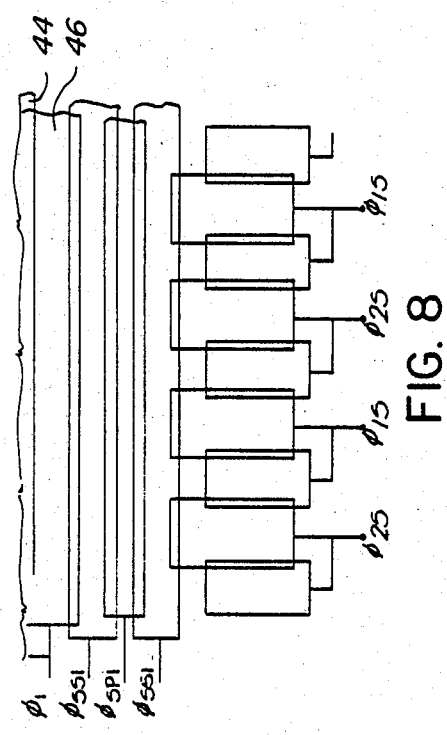
FIG. 8 is a schematic plan view of interface circuitry between the imaging element of FIG. 5 and a serial shift register.

The interface circuitry (FIG. 8) comprises transfer electrodes $\phi_{SS1}$ and $\phi_{SS2}$, and a storage electrode $\phi_{SP1}$.

Figure 9:
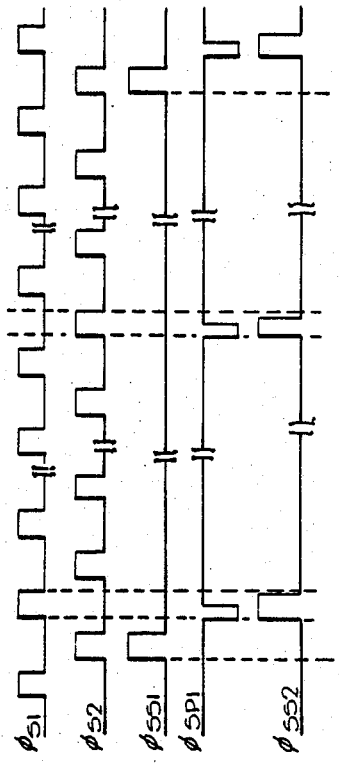
FIG. 9 is a timing diagram showing clocking of the FIG. 8 interface circuitry.

As illustrated in the FIG. 9 timing sequence, regular clocking pulses are applied alternately to electrodes $\phi_{S1}$ and $\phi_{S2}$ to shift information through the shift register.

Figure 10:
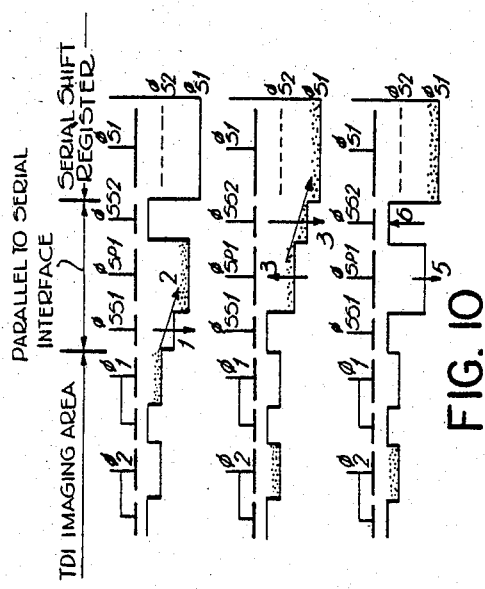
FIG. 10 shows variations, with time, in potential level existing in the interface circuitry.

In operation, a pulse is first applied to electrode $\phi_{SS1}$ to remove the underlying potential barrier whereupon as shown in FIG. 10 charge stored under $\phi_1$ gravitates to the potential well under $\phi_{SP1}$. The potential barrier under $\phi_{SS1}$ is then restored. Subsequently the potentials applied to $\phi_{SP1}$ and $\phi_{SS1}$ are reversed so that charges stored under $\phi_{SP1}$ can flow towards the shift register. Entry of charge into the shift register is only permitted, however, if shift register electrodes $\phi_{S1}$ and $\phi_{S2}$ are pulsed so as to produce underlying potential wells. In order that the stage length of the two-phase charge coupled shift register does not unduly limit the resolving power of the charge coupled imaging element in a direction transverse of its clocking direction, i.e. to maximize the packing density of channels in the element, an interlaced readout technique is adopted. Thus when the potentials on $\phi_{SP1}$ and $\phi_{SS2}$ are reversed, pulses are synchronously applied to half, only, of the shift register electrodes, for example, electrodes $\phi_{S1}$. On restoring the original potentials at $\phi_{SP1}$ and $\phi_{SS2}$, half of the output charge information is then in the shift register and half is stored under buffer electrode $\phi_{SP1}$. The information in the shift register is then shifted through to the output charge sensing circuit of FIG. 1.

From a last stage 25 of the output shift register, charge is moved into a potential well associated with the floating diffusion 26 and is sensed at gate 29 of transistor 30. The charge stored thus corresponds to the voltage at the transistor source. Subsequently a reset pulse at the gate of reset transistor 28 causes transfer of stored charge to diffuse region 27 connected to $V_{DD}$ thereby emptying the potential well at diffusion 26.

After half the period of the ripple clocking cycle, the potential at $\phi_{SP1}$ and $\phi_{SS2}$ is again temporarily reversed, but in synchronism with the lowering of potential under the alternating electrodes $\phi_{S2}$ so that the buffered charge information can be shifted into the shift register and clocked out.

Figure 12:
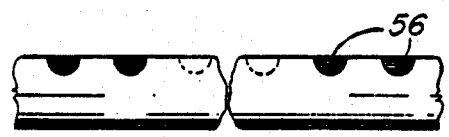
FIG. 12 is a sectional view showing the manner in which two mager elements are butted together.

A charge coupled imaging element fabricated on a single chip can incorporate a 96×512 array of pixels using the invention. As shown in FIG. 12 elements can be butted together to produce a larger imaging area. Individual silicon chips are scribed and polished to obtain a channel density at a butting region equal to the channel density throughout the chip. In fact, a two pixel wide loss at the abutment represents the lower limit in image loss using current fabrication techniques.

Butting elements in a manner that no loss of resolution between the two chips occurs, i.e. minimum loss of pixel elements precludes the use of clocking lines along the edges of the elements. Accordingly aluminum conductors are deposited on the silicon dioxide layer, which is etched away to reveal the polysilicon electrodes at contact locations. The aluminum is deposited in two layers L and U corresponding to distinct electrode energizing arrangements. This allows the chip area to be used as an 8×512 or a 1×512 as well as 96×512 array to provide an exposure control.

Figure 11:
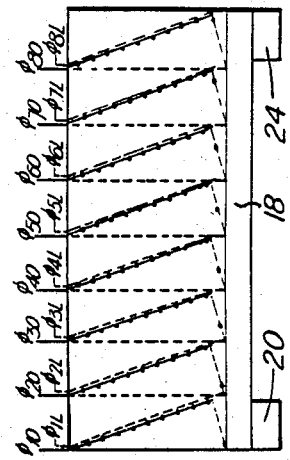
FIG. 11 shows a scheme for application of conductors to the FIG. 5 elements.

Considering the left-hand section of the FIG. 11 element, the full line (U) represents one clocking line which contacts one electrode pair, for example $\phi_1$, of each set $\phi_1$ to $\phi_8$ of the element. The next adjacent section of the clocking line contacts all electrode pairs $\phi_2$, etc. The broken line (L) represents an alternative set of eight clocking lines connected to respective electrode pairs of the output set $\phi_1$ to $\phi_8$ only.

The opaque aluminum clocking lines L and U are positioned in a repeated diagonal pattern so that all channels of the elements are subject to the same level of light blockage.

To form the high resistivity/low resistivity substrate, precautions are taken to avoid contamination of the high resistivity substrate at all stages of processing.

Contamination occurs mainly from: (1) impurities from furnace hardware such as furnace tubes, boats, baffles etc., generically termed furnaceware, during high temperature processing; (2) impurities which out-diffuse from regions of the low resistivity section of the wafer and contaminate the high resistivity section of the wafer; (3) thermal degradation of the material; (4) impurities deposited on the wafer during fabrication steps other than high temperature steps; and (5) impurities derived from the ambient gases.

The first three causes of contamination are the most difficult to control but are successfully controlled as follows:

(1) All furnaceware, including dummy wafers are HCl gettered at a temperature greater than those used for processing of the high resistivity wafers, and for a time which is greater than the time of processing of the high resistivity wafers. The furnace is subsequently flushed in an inert gas and then all the furnaceware is oxidized in an HCl/$O_2$ gas mixture. The oxide layer acts as an impurity barrier on the gettered furnaceware.

(2) To prevent impurity out-diffusion from low resistivity regions, such regions are capped by a barrier, such as a thick grown oxide, or a double barrier, such as nitride-on-grown oxide whenever the high resistivity region is bare.

(3) Thermal degradation is avoided by using: (a) insertion and retraction temperatures of approximately 800° C., the rates of insertion and retraction being approximately 2.5 inches per minute; (b) ramp rates approximately ±2°–5° C. per minute; and (c) a non-compensated wafer grown by the float zone process.

Generally the semiconductor wafer is prepared at a high temperature greater than 1000° C. to give a substrate which has low and high resistivity regions but all subsequent processing to form integrated circuit elements within these regions is performed at a lower temperature less than 1000° C.

To form the low resistivity region, a non-compensated silicon wafer prepared by the float zone process is capped by a thermally grown layer of 400 Å of oxide followed by 1000 Å of silicon nitride. The nitride layer is then removed from the area of the wafer designated as low resistivity and boron ions are implanted into the low resistivity site. The wafer is then heated to 1050° C. for more than 40 hours to cause the implanted ions to diffuse into the silicon and form a low resistivity region greater than 5 microns deep. Damage due to ion implantation is then removed by oxidation of the damaged silicon region and all capping layers are removed at low temperature. The charge coupled array within the high resistivity region and the sensing and control circuitry are then prepared using for example a standard NMOS CCD fabrication technique such as that described in U.S. Pat. No. 3,897,282 (J. J. White). The method described in this patent comprises the steps of:

(a) forming a layer of field oxide on a surface of the wafer and defining windows to expose the substrate in the oxide layer;

(b) growing a layer of gate oxide on the exposed surface of the substrate exposed at the windows;

(c) depositing a first layer of polysilicon on the layer of gate oxide and the exposed surface of the field oxide;

(d) forming a first masking layer on the polysilicon;

(e) etching the masking layer and the polysilicon layer to form separate polysilicon regions;

(f) thermally oxidizing the structure so that oxide encompasses the polysilicon portions;

(g) depositing a second layer of polysilicon on the oxide layer;

(h) forming a second masking layer on the polysilicon;

(i) etching through the masking, of second polysilicon, and oxide layers so that remainaing portions of the second polysilicon layer positionally relate to portions of the first polysilicon layer so as ultimately to establish CCD potential wells;

(j) simultaneously doping unmasked portions of the polysilicon layers, and the substrate at exposed areas to form device source and drain areas;

(k) forming a dielectric layer on each of the devices; and (l) forming electrical contact areas.

The sequence is particularly for fabrication of the imager sensor array. For the control circuitry, only a single level of polysilicon is required so production of this control circuitry is achieved using a subset of these steps (a) to (l).

It will be appreciated that instead of boron or n-type dopant such as arsenic or phosphorus can be implanted to produce the low resistivity region and the wafer can be subjected to a PMOS fabrication sequence to produce the sensor array and output circuit.

Although the embodiment of the invention described is a time delay and integration imager, the invention has applications beyond the field of imagers. Thus for example in CCD memories the memory must be periodically refreshed. By using a high resistivity substrate for the CCD memory, the refresh rate can be substantially reduced. However as in imagers, control and sensing circuits for the memory require integrated transistors which do not have an unacceptably low punch-through voltage. Thus high/low resistivity substrates may have application in some CCD memories.

What is claimed is:

1. A deep depletion charge coupled device imager for soft X-ray, visible and near infrared sensing, the imager comprising a charge coupled device formed in a high resistivity part of a silicon substrate, means for energizing the charge coupled device to generate a depletion layer within the high resistivity part within which layer minority carriers generated in response to absorption of photons are swept towards a surface of the imager, means for clocking the charge coupled device to transfer the accumulated minority carriers to a preamplifier circuit, the preamplifier circuit being formed in a low resistivity part of the silicon substrate and including a floating diffusion at a boundary between the low and high resistivity parts, said floating diffusion located adjacent a transfer gate of the charge coupled device thereby to receive charge from said device, said floating diffusion connected to the gate of an output transistor fabricated in the low resistivity region.

2. A deep depletion imager as claimed in claim 1 in which the high resistivity part has a resistivity in the range 100 ohm-cm to 50 Kohm-cm and the low resistivity part has a resistivity in the range 1 ohm-cm to 20 ohm-cm.

3. A deep depletion imager as claimed in claim 1 in which the substrate is p-type silicon.

4. A deep depletion imager as claimed in claim 1 in which the floating diffusion is contiguous with a source of a reset transistor fabricated in the low resistivity part, the reset transistor having a drain connected to the drain of the output transistor.

* * * * *